United States Patent
Matsui

(10) Patent No.: US 8,153,951 B2
(45) Date of Patent: Apr. 10, 2012

(54) OPTICAL COMMUNICATION DEVICE AND ELECTRONIC EQUIPMENT HAVING AN ARRAY OF LIGHT RECEIVING SECTIONS

(75) Inventor: Katsuyuki Matsui, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 436 days.

(21) Appl. No.: 12/420,338

(22) Filed: Apr. 8, 2009

(65) Prior Publication Data

US 2009/0256062 A1    Oct. 15, 2009

(30) Foreign Application Priority Data

Apr. 10, 2008    (JP) ................................ P2008-102546

(51) Int. Cl.
*G01J 1/42*    (2006.01)
(52) U.S. Cl. .............. 250/208.2; 250/214.1; 250/214 R; 348/272; 348/273; 348/277
(58) Field of Classification Search .............. 250/208.1, 250/208.2, 214.1, 214 R, 216; 348/272, 348/273, 277–280
See application file for complete search history.

(56) References Cited

U.S. PATENT DOCUMENTS

| 6,783,900 B2 * | 8/2004 | Venkataraman ................. 430/7 |
| 2005/0128509 A1 * | 6/2005 | Tokkonen et al. ............ 358/1.15 |
| 2006/0054782 A1 * | 3/2006 | Olsen et al. ................ 250/208.1 |
| 2006/0056855 A1 | 3/2006 | Nakagawa et al. |
| 2006/0067707 A1 | 3/2006 | Maniam et al. |

FOREIGN PATENT DOCUMENTS

| JP | 2004-193908 A | 7/2004 |
| JP | 2004-221747 A | 8/2004 |
| JP | 2006-109461 A | 4/2006 |

* cited by examiner

*Primary Examiner* — Francis M Legasse, Jr.
(74) *Attorney, Agent, or Firm* — Nixon & Vanderhye P.C.

(57) ABSTRACT

An optical communication device includes a one-chip light receiving element having a plurality of light receiving sections having light receiving sensitivity to different wavelength ranges in a visible light spectrum. The photodiode has a light receiving surface, which is divided into nine blocks. For each light receiving section group in which light receiving sections have the light receiving sensitivity to an identical wavelength range, the light receiving sections are dispersedly placed in corresponding ones of the blocks.

26 Claims, 13 Drawing Sheets

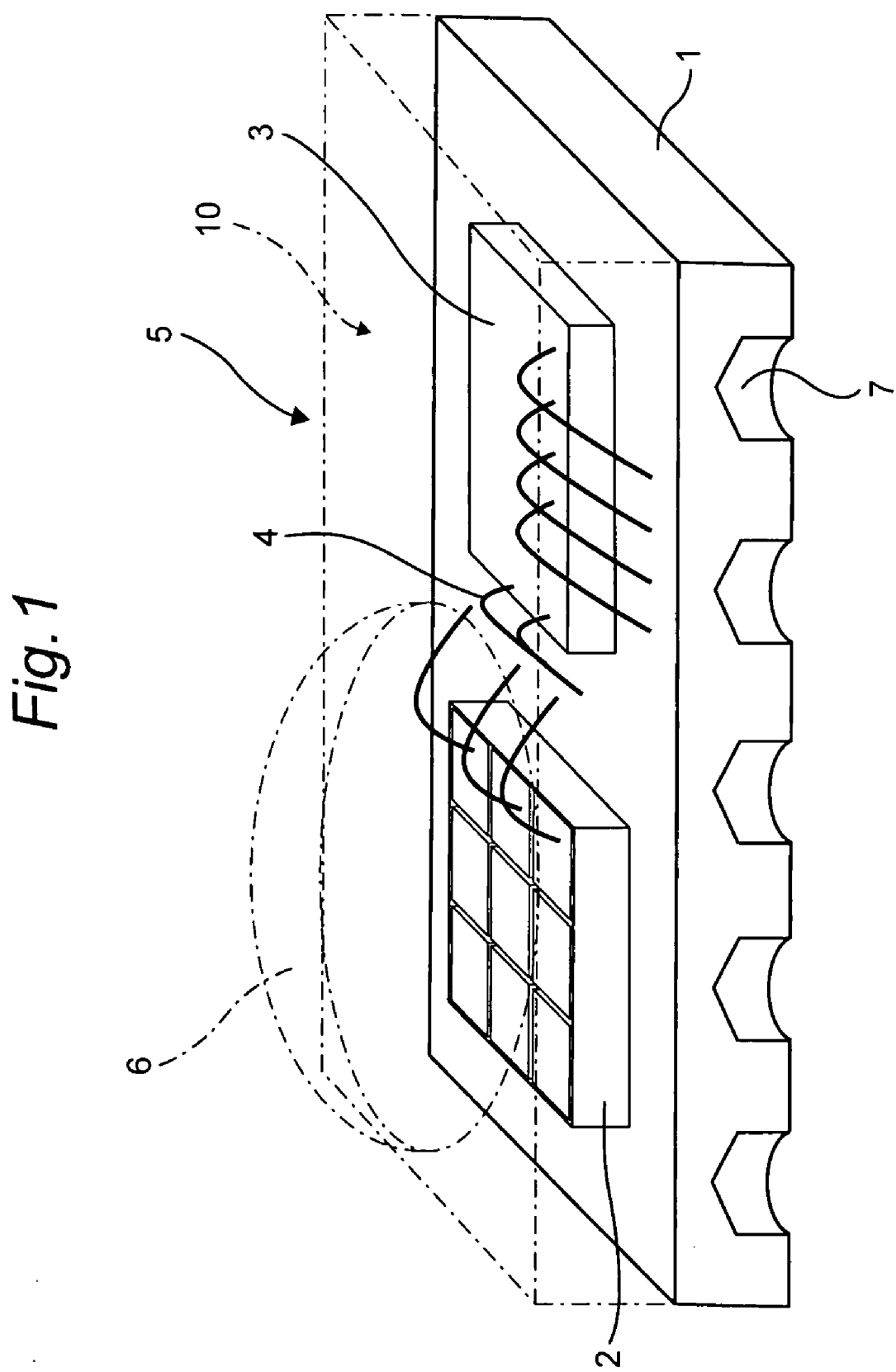

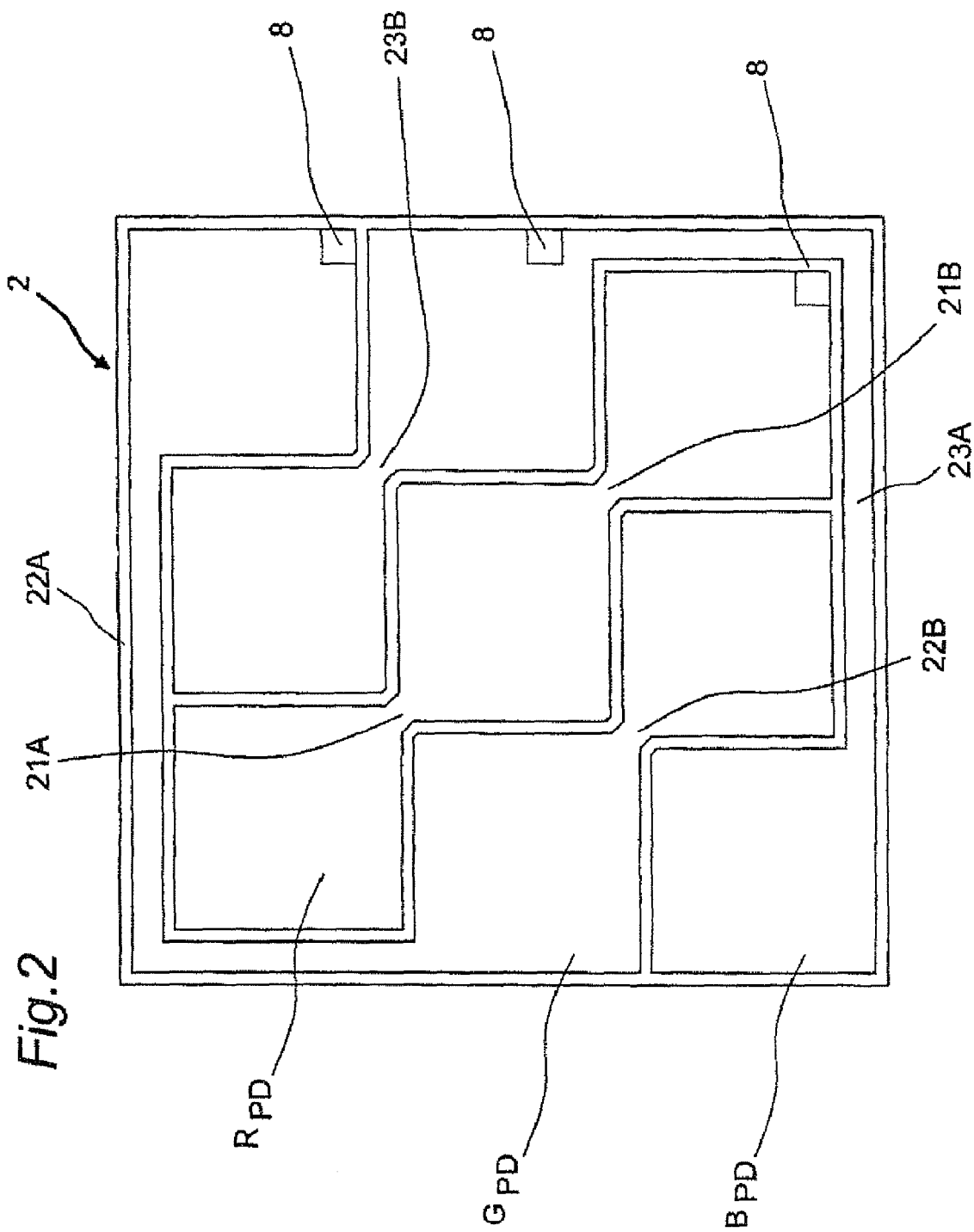

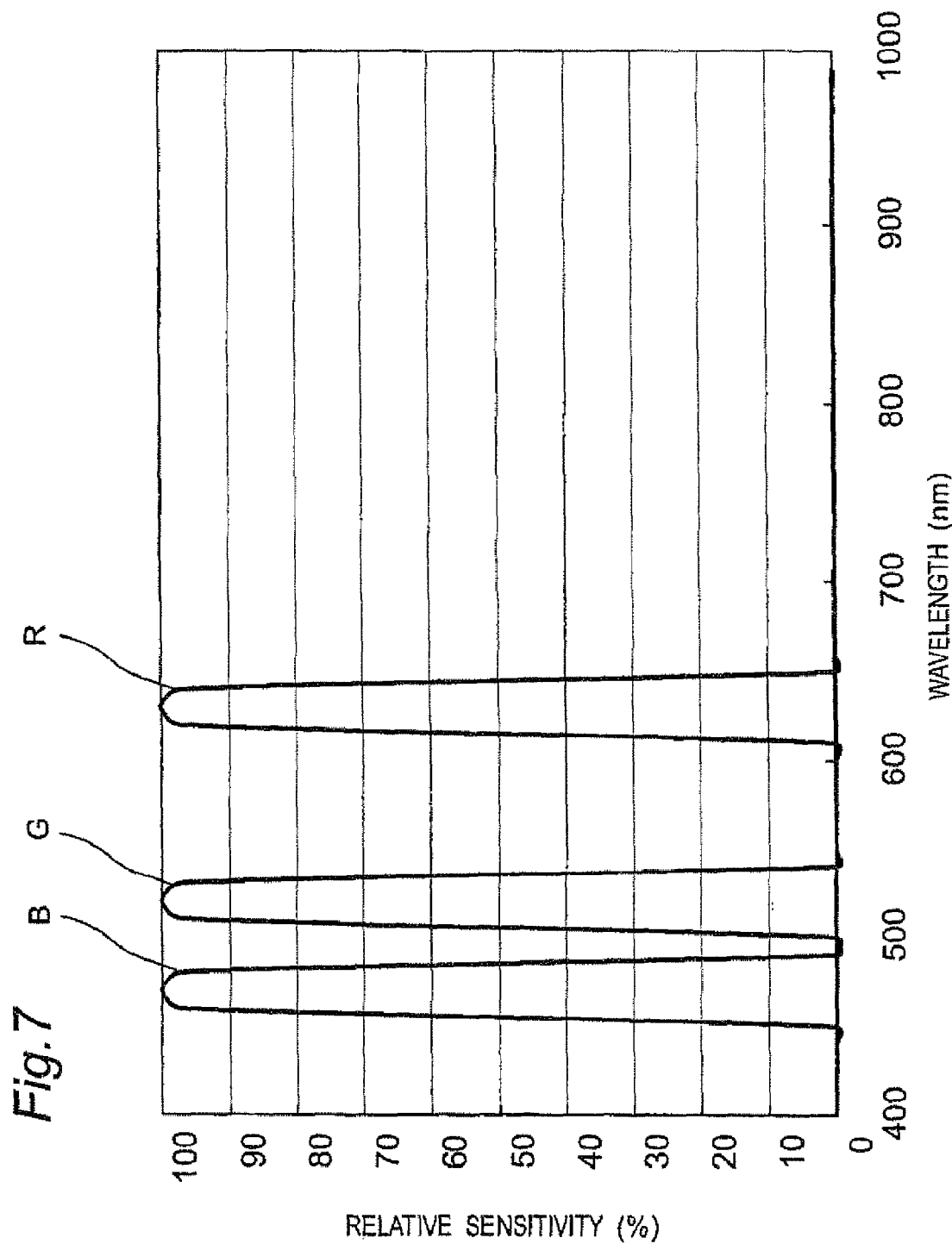

OUTPUT OF $R_{PD}$

OUTPUT OF $R_{amp}$

OUTPUT OF $R_{cmp}$

Fig. 13A
PLACEMENT EXAMPLE 1

| R | B | G |
|---|---|---|
| G | R | B |
| B | G | R |

Fig. 13B
PLACEMENT EXAMPLE 2

| R | G | B |
|---|---|---|
| B | R | G |
| G | B | R |

Fig. 13C
PLACEMENT EXAMPLE 3

| B | G | R |
|---|---|---|
| R | B | G |
| G | R | B |

Fig. 13D
PLACEMENT EXAMPLE 4

| B | R | G |
|---|---|---|
| G | B | R |
| R | G | B |

Fig. 13E
PLACEMENT EXAMPLE 5

| G | R | B |
|---|---|---|
| B | G | R |
| R | B | G |

Fig. 13F
PLACEMENT EXAMPLE 6

| G | B | R |
|---|---|---|
| R | G | B |
| B | R | G |

OPTICAL COMMUNICATION DEVICE AND ELECTRONIC EQUIPMENT HAVING AN ARRAY OF LIGHT RECEIVING SECTIONS

This nonprovisional application claims priority under 35 U.S.C. §119(a) on Patent Application No(s). 2008-102546 filed in Japan on Apr. 10, 2008, the entire contents of which are hereby incorporated by reference.

BACKGROUND AND SUMMARY

The technology presented herein relates to an optical communication device and electronic equipment, and more particularly to an optical communication device and electronic equipment suitable for visible light communication, such as consumer-use devices incorporating visible light communication functions using LED lighting and vehicle-mounted devices incorporating visible light communication functions using LED signaling devices.

With development of high-performance and low-cost LEDs (Light Emitting Diodes), application of the LEDs to lighting equipment is rapidly spreading due to their characteristics of lower power consumption and long life. In these circumstances, visible light communication using the LEDs has also been proposed (see, e.g., JP 2004-221747 A).

A large number of methods have been proposed for the visible light communication including a method in which light receiving signals divided per optical wavelengths are transmitted for multi-channel communication (see, e.g., JP 2006-109461 A), a method in which a speech sound is subjected to AM modulation for transmission (see, e.g., JP 2004-193908 A), and a digital communication method involving four pulse position modulation. There are demands for small-size optical communication devices which implement these communication methods.

However, there has not yet been proposed any general-purpose device which supports all the methods and does not depend on a specific visible light communication method, and therefore it was necessary to prepare optical communication devices dedicated to a method to be used. For example, there is no optical communication device having both the analog output and the digital output, and in the case of using both the outputs by switching, it was necessary to mount both the output devices. Moreover, there is no optical communication device having an output which is divided into R, G, and B regions, and therefore, in order to transmit and receive different data sets in respective wavelength ranges of R, G, and B, some measures have been needed such as preparing three optical communication devices which receive signals of all the visible light wavelength ranges, and providing color filters to the entire surfaces of the respective optical communication devices.

Accordingly, a feature of an example embodiment presented herein is to provide an optical communication device and electronic equipment with versatility which can communicate in visible light wavelength ranges with a simple configuration regardless of the communication method.

In order to achieve the above feature, an optical communication device according to an aspect of the present embodiment comprises:

a one-chip light receiving element having a plurality of light receiving sections with light receiving sensitivity to different wavelength ranges in a visible light spectrum, wherein the plurality of light receiving sections are divided into different light receiving section groups by the wavelength range to which the light receiving sections have the light receiving sensitivity, the light receiving element has a light receiving surface divided into a plurality of blocks, and light receiving sections in one light receiving section group having the light receiving sensitivity to an identical wavelength range are dispersedly placed in the respective blocks.

In the optical communication device with the above configuration, the light receiving sections in each light receiving section group, which have the light receiving sensitivity to an identical wavelength range, are dispersedly placed on the light receiving surface of the light receiving element, so that the light receiving sections of each light receiving section group are present in positions different from each other on the light receiving surface of the light receiving element, and therefore in the case of receiving the transmission light from the front side, the light receiving sections of each light receiving section group receive the transmission light, thereby achieving good reception performance. Moreover, even when transmission light coming obliquely from above the light receiving surface of the light receiving element is received and the transmission light does not strike upon the entire light receiving surface, the signal beam strikes upon at least a part of the respective light receiving sections of all the light receiving section groups, so that the reception limit angle in the oblique direction can be enlarged. Therefore, it becomes possible to realize an optical communication device with versatility which can communicate in visible light wavelength ranges with a simple configuration regardless of communication methods.

In one embodiment, the light receiving surface of the light receiving element is divided into a plurality of grid-like blocks, and the light receiving sections adjacent to each other along a row direction and a column direction of the light receiving element have the light receiving sensitivity to different wavelength ranges.

In this embodiment, in the state where the respective light receiving sections of each light receiving section group are dispersedly placed in the respective blocks, which are placed like grid on the light receiving surface of the light receiving element, the light receiving sections which are adjacent to each other along the row direction and the column direction have light receiving sensitivity to different wavelength ranges, so that the light receiving sections having the light receiving sensitivity to an identical wavelength range are not adjacent to each other but are dispersedly placed. Accordingly, in the case where transmission light coming obliquely from above the light receiving surface of the light receiving element is received and the transmission light strikes upon only a part of the light receiving surface, it becomes possible to ensure that the signal beam strikes upon at least a part of the respective light receiving sections of all the light receiving section groups.

In one embodiment, among the plurality of light receiving sections of the light receiving element, light receiving sections in one light receiving section group having the light receiving sensitivity to an identical wavelength range are connected to each other via joints.

In the embodiment, among the plurality of the light receiving sections of the light receiving element, the light receiving sections in one light receiving section group, which have the light receiving sensitivity to an identical wavelength range, are connected to each other via the joint, by which light receiving signals in one light receiving section group can be gathered so that one light receiving signal can be extracted from the light receiving section group to the outside via an output terminal.

In one embodiment, there are a plurality of light receiving section groups, in each of which the light receiving sections have the light receiving sensitivity to an identical wavelength range, and the light receiving section groups are almost equal in a total area of the light receiving sections of the group.

In this embodiment, because the light receiving section groups are almost equal in the total area of the light receiving sections of the group, when the transmission light coming from the front side is received, the light receiving section groups corresponding to the respective wavelength ranges have equal reception areas to receive the transmission light. Thus, if the level of the transmission light for every wavelength range is identical, then output signals of an identical level can be acquired.

In one embodiment, there are three light receiving section groups, each of which has three light receiving sections having light receiving sensitivity to an identical wavelength range, wherein the light receiving surface of the light receiving element is divided into grid-like nine blocks of three rows and three columns, in which a first light receiving section group is placed at a block of first row first column, a block of second row second column, and a block of third row third column; a second light receiving section group is placed at a block of first row second column, a bloc of second row third column, and a block of third row first column, and a third light receiving section group is placed at a block of first row third column, a block of second row first column, and a block of third row second column.

In this embodiment, the light receiving surface of the light receiving element is divided into grid-like nine blocks in three rows and three columns, in which the light receiving sections in a first light receiving section group may be placed at a block of first row first column, a block of second row second column and a block of third row third column; the light receiving sections in a second light receiving section group may be placed at a block of first row second column, a bloc of second row third column and a block of third row first column; and the light receiving sections in a third light receiving section group may be placed at a block of first row third column, a block of second row first column and a block of third row second column. In this way, the light receiving section groups corresponding to three wavelengths can be placed dispersedly with efficiency.

In one embodiment, the optical communication device has a condenser lens provided above the light receiving element for condensing an external light beam to a plurality of light receiving sections.

In this embodiment, the light beam from the outside is condensed to the light receiving sections with use of the condenser lens provided above the light receiving element, so that the light receiving surface of the light receiving element can efficiently receive the transmission light, and thereby the communication distance can be increased.

In one embodiment, the tight receiving element is configured to output a plurality of light receiving signals, said light receiving signals having undergone photoelectric conversion per every light receiving section group which has light receiving sensitivity to the identical wavelength range. The optical communication device further comprises a receiving integrated circuit for converting the plurality of light receiving signals from the light receiving element and outputting the signals as intended output signals.

In this embodiment, a plurality of light receiving signals from the light receiving element are converted by the receiving integrated circuit and outputted as intended output signals, which makes it possible to obtain a light receiving signal for every light receiving section group of which the component light receiving sections have sensitivity to light of an identical wavelength range.

In one embodiment, the receiving integrated circuit outputs the plurality of light receiving signals received from the light receiving element to outside as digital signals.

In this embodiment, a plurality of light receiving signals or the light receiving element are outputted from the receiving integrated circuit to the outside as digital signals, so that the device becomes easily applicable to the digital communication system.

In one embodiment, the receiving integrated circuit outputs the plurality of light receiving signals received from the light receiving element to outside as analog signals.

In this embodiment, a plurality of light receiving signals of the light receiving element are outputted from the receiving integrated circuit to the outside as analog signals, so that the device becomes easily applicable to the analog communication system.

In one embodiment, the receiving integrated circuit is configured to output the plurality of light receiving signals received from the light receiving element to outside as digital signals and also as analog signals.

In this embodiment, a plurality of light receiving signals of the light receiving element are outputted from the receiving integrated circuit to the outside as digital signals and analog signals, so that the device becomes applicable to both the digital communication system and the analog communication system. Thus, the versatility of the device is enhanced.

In one embodiment, the receiving integrated circuit has a switching section for, in response to a signal selection signal received from outside, selecting whether to output each of the plurality of light receiving signals received from the light receiving element as an analog signal or as a digital signal.

In this embodiment, the switching circuit is configured to select, in response to a signal selection signal from the outside, whether each light receiving signal from the light receiving element should be outputted as an analog signal or as a digital signal, so that the device becomes applicable to both the digital communication system and the analog communication system, and thereby versatility of the device can be enhanced.

In one embodiment, in response to the signal selection signal, the switching section of the receiving integrated circuit selects collectively per the plurality of the light receiving signals whether to output the light receiving signals as analog signals or as digital signals.

In this embodiment, because the switching section selecting per the plurality of the light receiving signals whether to output the light receiving signals as analog signals or as digital signals, the device is applicable to both the digital communication system and the analog communication system. Thus, versatility of the device can be enhanced.

In one embodiment, the receiving integrated circuit has an output selecting section for selecting any one of a plurality of light receiving signals switched by the switching section in response to an output selection signal received from outside, and outputting the selected signal to the outside.

In this embodiment, selecting any one of a plurality of light receiving signals switched by the switching section in response to an output selection signal received from outside, and outputting the selected signal enables the reduction in number of output terminals, the downsizing of the optical communication device, and improvement in mounting reliability.

Electronic equipment according to another aspect of the present technology comprises the optical communication device according to any one of the above embodiments.

Due to the provision of the optical communication device, it is possible to realize electronic equipment that can, with simple structure, perform communications in the visible wavelength regions.

As is apparent from above, according to the present embodiment, it is possible to realize an optical communication device and electronic equipment with versatility which can communicate in visible light wavelength ranges with a simple configuration regardless of the communication method.

BRIEF DESCRIPTION OF THE DRAWINGS

The present embodiment will become more fully understood from the detailed description given hereinbelow and the accompanying drawings which are given by way of illustration only, and thus are not intended to limit the present embodiment, and wherein:

FIG. 1 is a perspective view of an optical communication device in a first embodiment;

FIG. 2 is a plan view of a photodiode in the optical communication device;

FIG. 7 is a view showing the spectral sensitivity of each light receiving section of the photodiode in the optical communication device;

FIGS. 13A-13F show placement examples of R, G and B regions of the photodiode in the optical communication device.

DETAILED DESCRIPTION

Figure 3A:
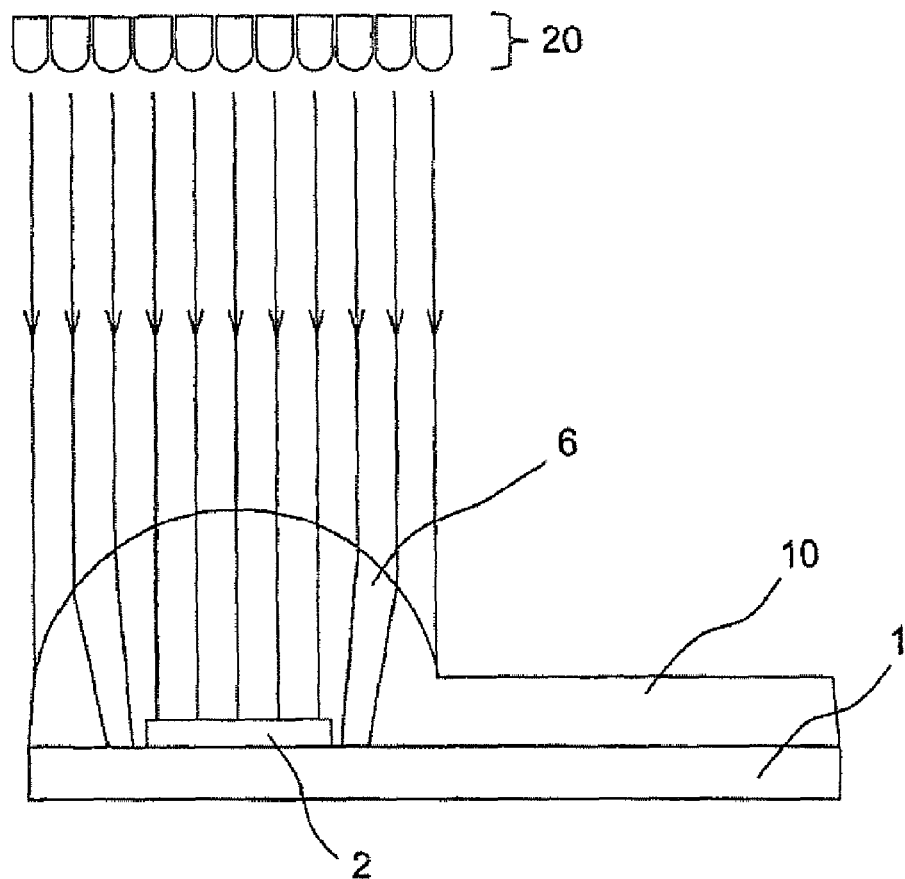
FIG. 3A is a schematic cross-sectional view showing the optical communication device when receiving transmission light from the front side of the optical communication device.

The optical communication device and electronic equipment will be described in detail in conjunction with the embodiments with reference to the drawings.

(First Embodiment)

FIG. 1 is a perspective view of an optical communication device 5 in a first embodiment, in which a photodiode 2 as an example of the light receiving element and a receiving IC 3 as an example of the receiving integrated circuit are die bonded on a hard board 1 made of glass epoxy resin and the like. Interconnection to an unshown wiring pattern is made by wire bonding with use of an Au wire 4, and a mold section 10 having a condenser lens 6 is formed on the photodiode 2 by molding with use of epoxy resin and the like. A plurality of contact terminals 7 are provided on the board 1 for external connection.

FIG. 2 is a diagram for explaining the details of the photodiode 2, in which three light receiving sections $R_{PD}$ for receiving visible light in a red wavelength range (near 630 nm), three light receiving sections $G_{PD}$ for receiving visible light in a green wavelength range (near 520 nm) and three light receiving sections $B_{PD}$ for receiving visible light in a blue wavelength range (near 479 nm) are formed in an area divided into nine blocks on the light receiving surface of the photodiode 2 in such a manner that the light receiving sections $R_{PD}$ are partially connected to each other, that the three light receiving sections $G_{PD}$ are partially connected to each other, and that the three light receiving sections $B_{PD}$ are partially connected to each other.

More specifically, the light receiving surface of the photodiode 2 is divided into grid-like nine blocks ins three rows and three columns, in which a first light receiving section group ($R_{PD}$) is placed at a block of first row first column, a block of second row second column, and a block of third row third column; a second light receiving section group ($G_{PD}$) is placed at a block of first row second column, a block of second row third column, and a block of third row first column; and a third light receiving section group ($B_{PD}$) is placed at a block of first row third column, a block of second row first column, and a block of third row second column. Three light receiving sections $R_{PD}$ of the first light receiving section group are connected to each other via joints 21A and 21B. Three light receiving sections $G_{PD}$ of the second light receiving section group are connected to each other via joints 22A and 22B. Further, three light receiving sections $B_{PD}$ of the third light receiving section group are connected to each other via joints 23A and 23B.

Figure 3B:
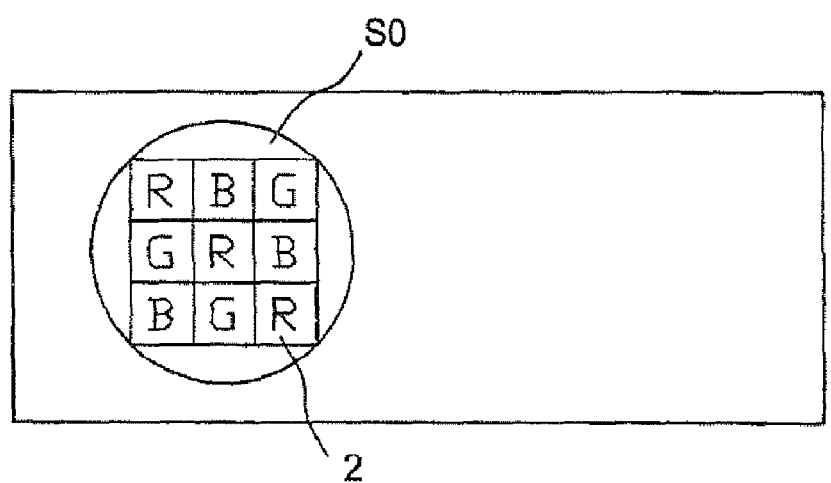
FIG. 3B is a schematic view showing light receiving sections when receiving transmission light from the front side of the optical communication device.

With this placement method, the light receiving sections of each wavelength range, which have the equal area, are dispersedly present at different positions on the photodiode 2. Accordingly, as shown in FIG. 3A and FIG. 3B, upon reception of transmission light from a front transmitting section 20 (in which case the light collecting area is denoted as S0), the light receiving sections of each of the wavelength ranges of R, G and B receive light with an equal reception area, so that best reception becomes possible.

Figure 4A:
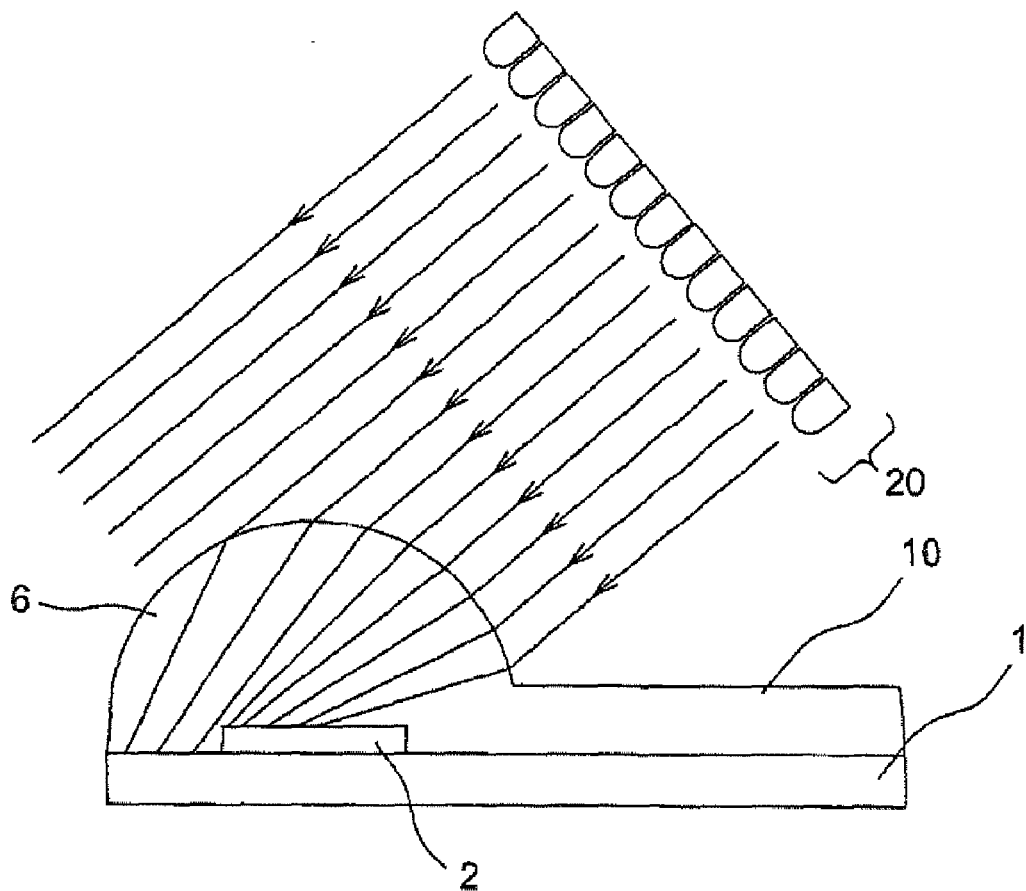
FIG. 4A is a schematic cross-sectional view showing the optical communication device when receiving transmission light from a diagonally upward section of the optical communication device.
Figure 4B:
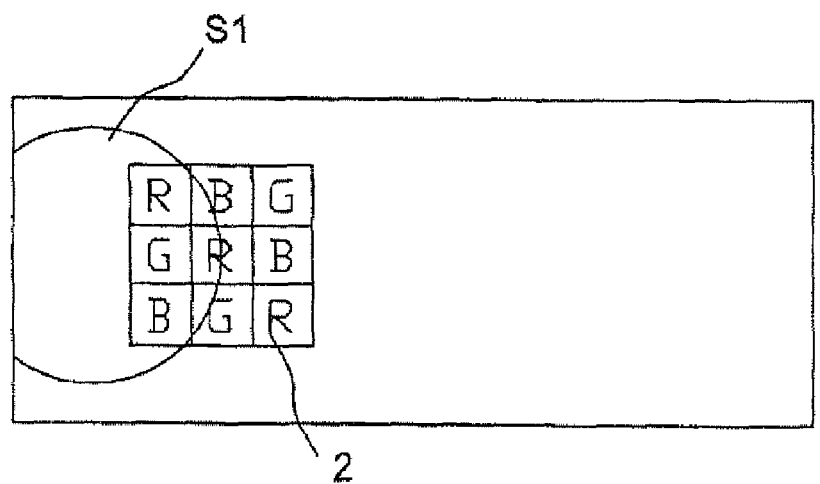
FIG. 4B is a schematic view showing the light receiving sections when receiving transmission light from a diagonally upward section of the optical communication device.

Moreover, as shown in FIG. 4A and FIG. 4B, in the case of receiving transmission light from a diagonally upward transmitting section 20 (in which case the light collecting area is denoted as S1), although the light receiving area differs, the signal beam strikes upon the respective light receiving sections having light receiving sensitivity to all the wavelength ranges of R, G and B, so that the reception limit angle in the oblique direction can advantageously be enlarged.

Figure 5A:
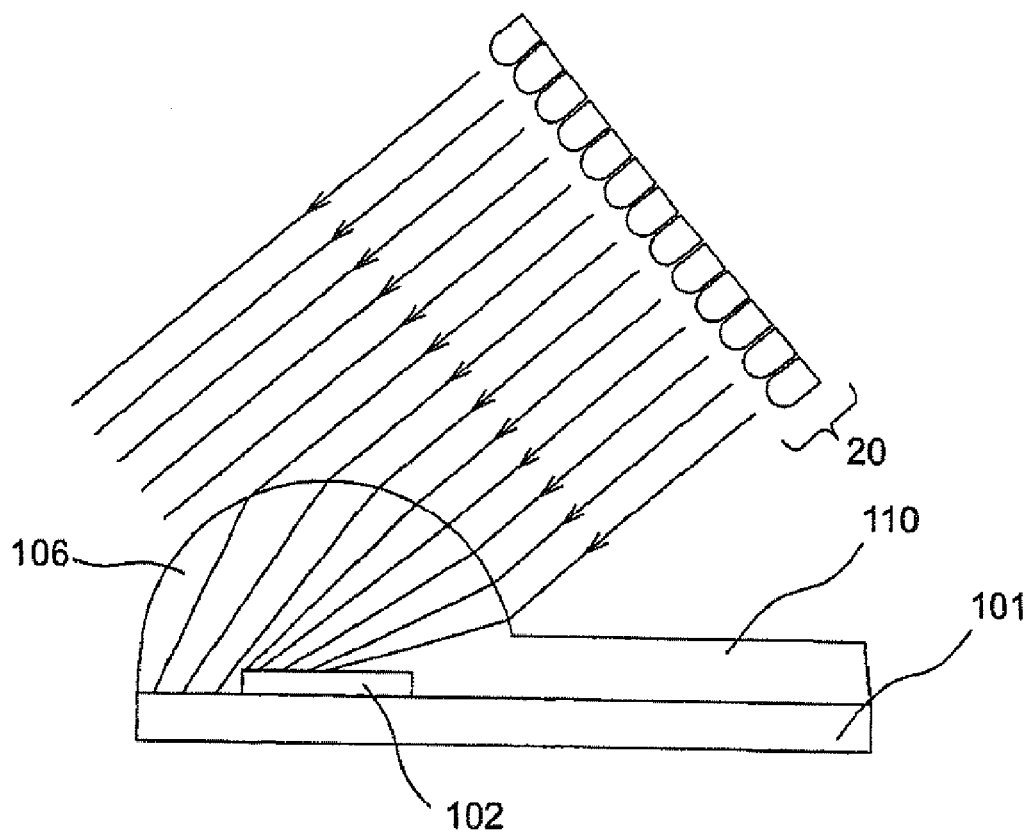
FIG. 5A is a schematic cross-sectional view showing an optical communication device when receiving transmission light from the front side of the optical communication device.
Figure 5B:
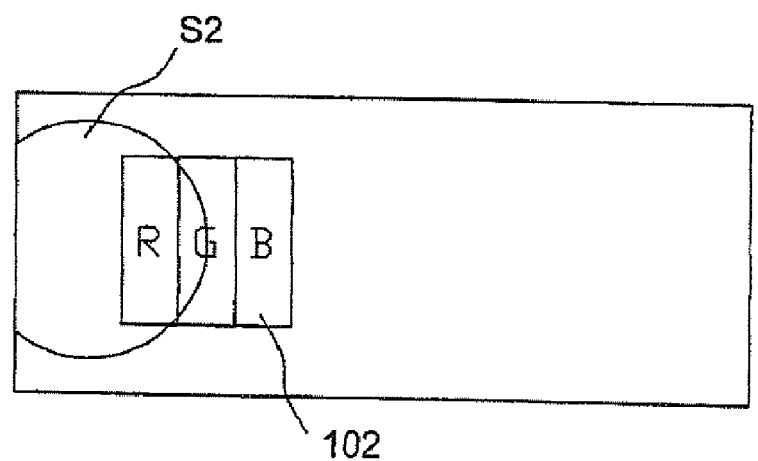
FIG. 5B is a schematic view showing light receiving sections of the optical communication device when receiving transmission light from the front side of the optical communication device.
Figure 6A:
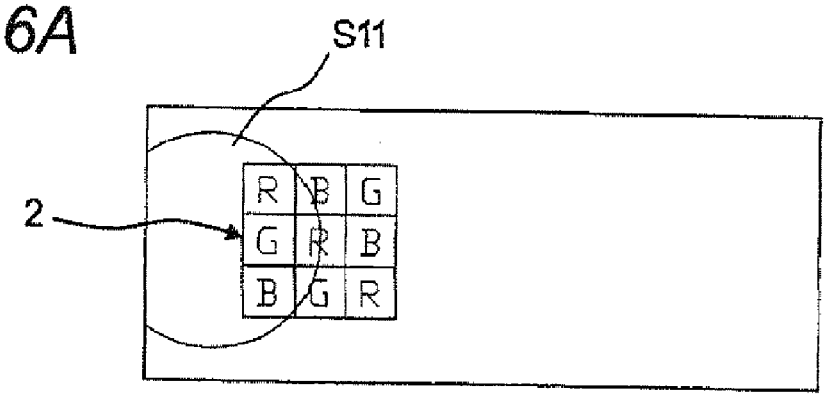
FIG. 6A is a schematic view showing the light receiving sections of the optical communication device 1 in the first embodiment when receiving transmission light from the front side of the optical communication device.
Figure 6B:
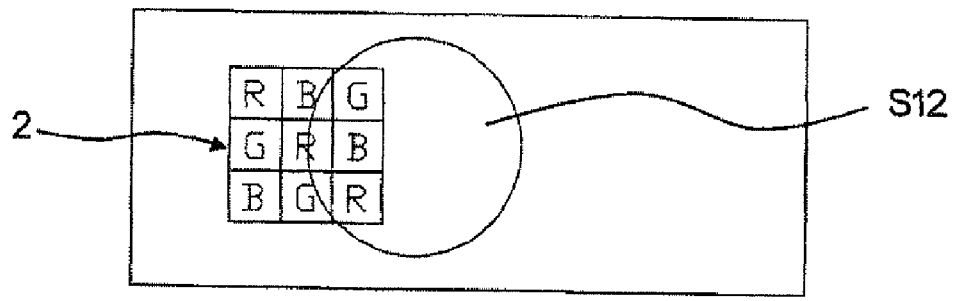
FIG. 6B is a schematic view showing the light receiving sections of the optical communication device when receiving transmission light from the front side of the optical communication device.
Figure 6C:
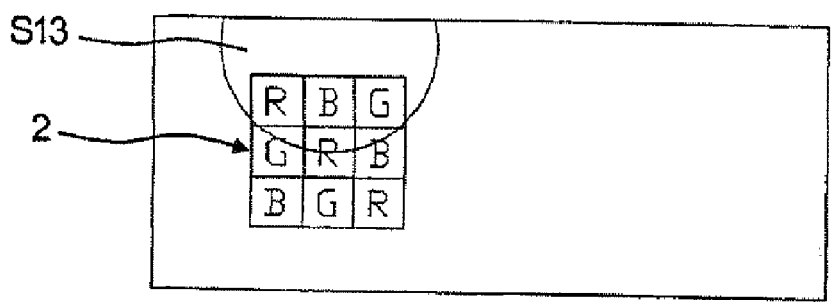
FIG. 6C is a schematic view showing the light receiving sections of the optical communication device when receiving transmission light from the front side of the optical communication device.
Figure 6D:
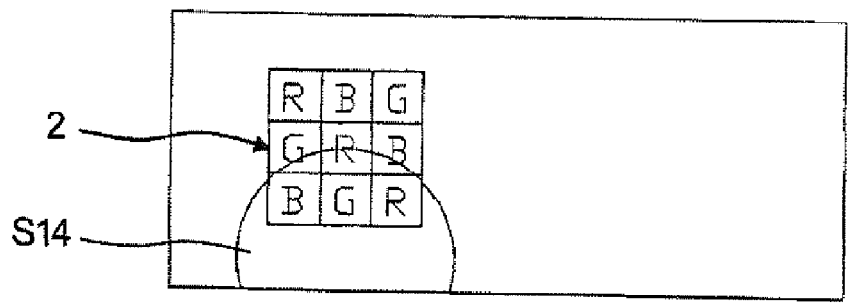
FIG. 6D is a schematic view showing the light receiving section of the optical communication device when receiving transmission light from the front side of the optical communication device.

As compared with the foregoing, FIG. 5A and FIG. 5B show an optical communication device in which the light receiving sections with the wavelength ranges of R, G and B are simply placed in order of R, G and B. In FIG. 5A and FIG. 5B, there are shown a board 101, a photodiode 102, a condenser lens 106 and a mold section 110. With the configuration of the optical communication device, in the case where a transmission light from, for example, the diagonally upward transmitting section 20 is received (in which case the light collecting area is denoted as S2), the signal beam strikes upon the entire light receiving section of the wavelength of R, the signal beam strikes upon a part of the light receiving section of the wavelength G, and no signal beam strikes upon the light receiving section of the wavelength B.

In the optical communication device 5 of the first embodiment, as shown in FIG. 6A through FIG. 6D, a signal beam strikes upon light receiving sections of all the wavelength ranges of R G, and B even in the case of receiving the transmission light at any circumferential position from diagonally upward sections (in which cases light collecting regions are denoted as S11-S14, respectively).

In FIG. 2, reference sign 8 denotes an anode pad of each of the light receiving sections $R_{PD}$, $G_{PD}$ and $B_{PD}$, and each of the anode pads 8 is wire-bonded. A cathode pad (not shown) of each of the light receiving sections $R_{PD}$, $G_{PD}$ and $B_{PD}$ is on the back side of the chip and is connected by die bonding. The cathode pad may be provided on the same surface as the anode pad 8. Further, the anode pad and the cathode pad may be exchanged so that the anode pad may be placed on the back side. In the first embodiment, although the wavelength range is divided into three ranges of R, G and B, the wavelength range may be divided still more finely to increase the number of data sets to be communicated.

FIG. 7 shows the spectral responsivity of each of the light receiving sections $R_{PD}$, $G_{PD}$ and $B_{PD}$ of the photodiode 2. In FIG. 7, a horizontal axis represents a wavelength (nm) and a vertical axis represents a relative sensitivity (%) with respect to a peak light reception sensitivity.

Figure 8:
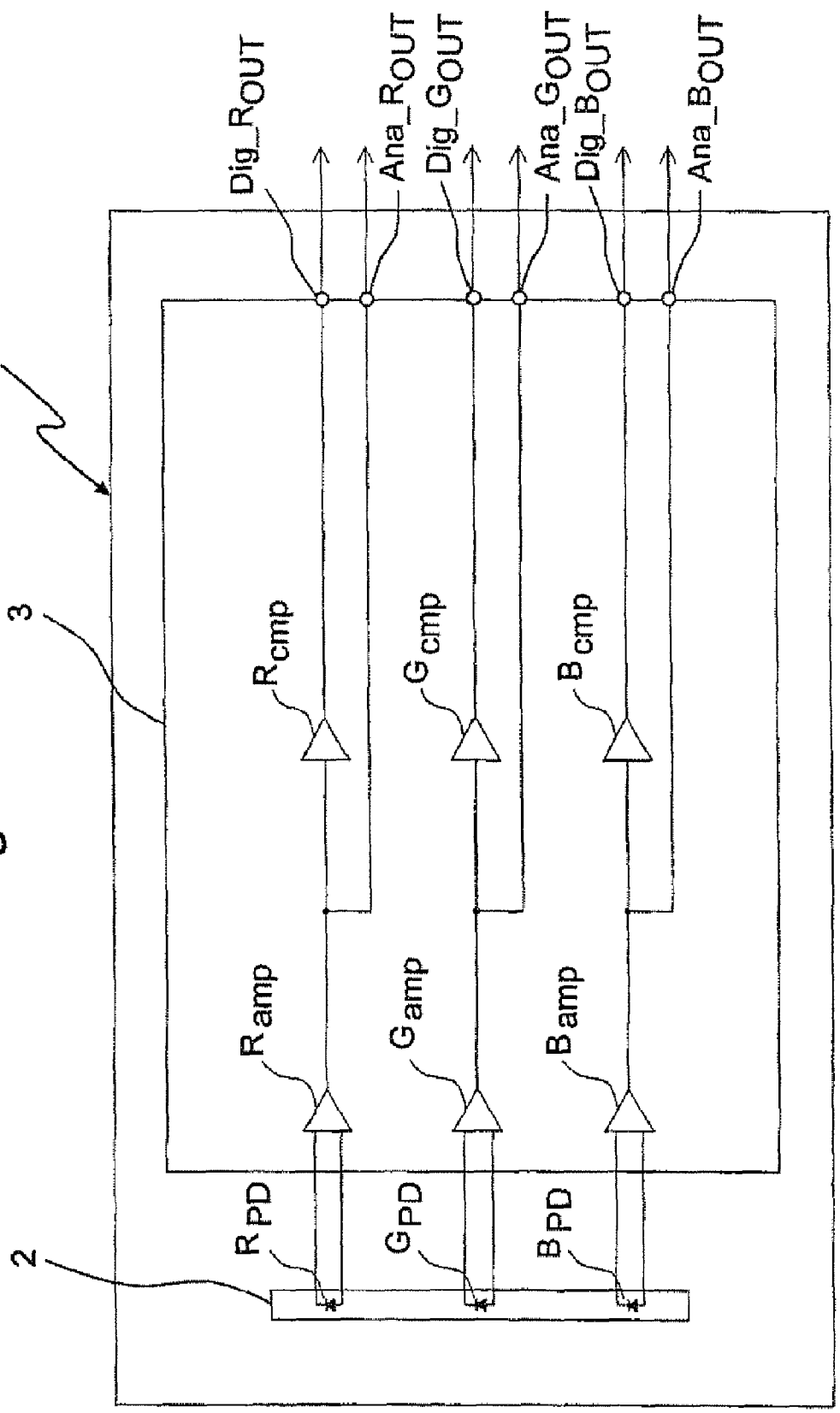
FIG. 8 is a block diagram of the optical communication device.

FIG. 8 is a block diagram of the optical communication device 5 in the first embodiment, in which the photodiode 2 is provided with the light receiving sections $R_{PD}$, $G_{PD}$ and $B_{PD}$ each having light receiving sensitivity in the respective wavelength ranges of R, G and B. The light receiving section $R_{PD}$ is light receiving sections of the red region in visible light spectrum, the light receiving section $G_{PD}$ is a light receiving section of the green region in visible light spectrum, and the light receiving section $B_{PD}$ is a light receiving section of the blue region in visible light spectrum.

The outputs of the respective light receiving sections $R_{PD}$, $G_{PD}$ and $B_{PD}$ are inputted into amplification circuits $R_{amp}$, $G_{amp}$ and $B_{amp}$, where waveform amplification is performed thereon, and then the outputs are outputted as analog signals by signal output terminals for external connection Ana_$R_{OUT}$, Ana_$G_{OUT}$ and Ana_$B_{OUT}$. The outputs of the respective light receiving sections $R_{PD}$, $G_{PD}$ and $B_{PD}$ are also inputted into waveform shaping circuits $R_{cmp}$, $G_{cmp}$ and $B_{cmp}$, and are outputted as digital signals from signal output terminals for external connection Dig_$R_{OUT}$, Dig_$G_{OUT}$ and Dig_$B_{OUT}$.

Figure 9A:
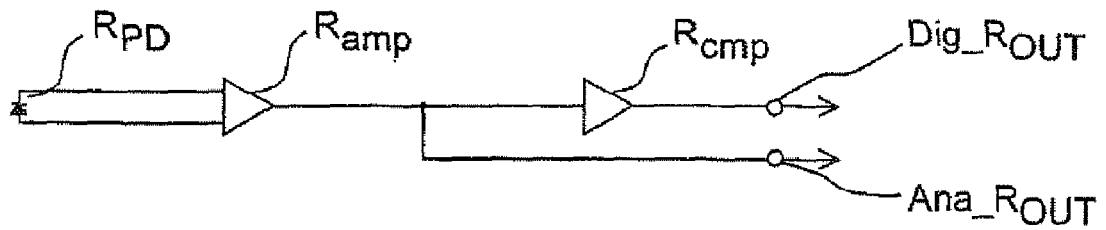
FIG. 9A is a circuit diagram showing the light receiving section of an R region.
Figure 9B:
FIG. 9B is a view of a faint signal which is photoelectrically converted in the light receiving section of the R region.
Figure 9C:
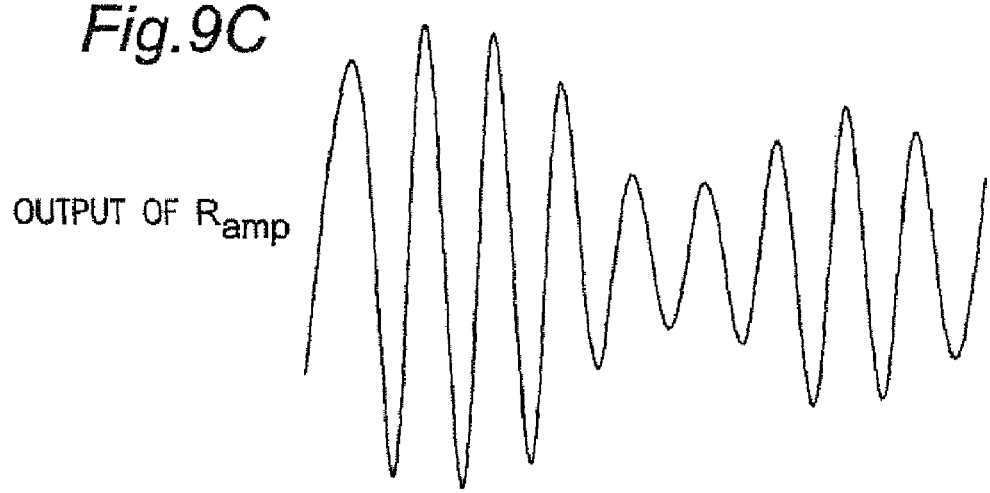
FIG. 9C is a view of an analog signal amplified in an amplification circuit.
Figure 9D:
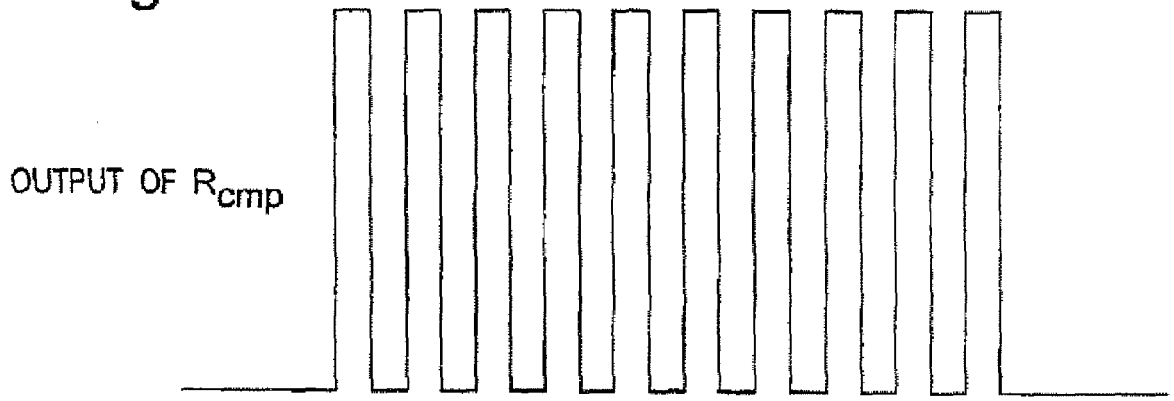
FIG. 9D is a view of a digital signal obtained by shaping the waveform of the analog signal in a waveform shaping circuit so as to be outputted.

FIG. 9A is a circuit diagram showing the light receiving section $R_{PD}$ in the R region, and FIGS. 9B-FIG. 9D are views explaining signals of each of circuits shown in FIG. 9A. A faint signal photoelectrically converted by the light receiving section $R_{PD}$ (FIG. 9B) is amplified in the amplification circuit $R_{amp}$ and is outputted as an analog signal (FIG. 9C). The analog signal is further subjected to waveform shaping in the waveform shaping circuit $R_{cmp}$ and is outputted as a digital signal (FIG. 9D).

Thus, the visible light communication device can be implemented which support all the communication methods regardless of whether they involve digital signals or analog signals in all the visible light wavelength ranges.

Although the signal of each light receiving section is outputted as both the digital signal and the analog signal in the first embodiment, it is also possible to structure the optical communication device as an optical communication device dedicated to digital output or as an optical communication device dedicated to analog output depending on the communication method to be used. In that case, the number of external connection terminals is reduced, which can contribute to downsizing of the optical communication device and/or improvement in mounting reliability.

According to the optical commination device of the above configuration, the light receiving sections $R_{PD}$, $G_{PD}$, $B_{PD}$ in each light receiving section group, which have the light receiving sensitivity to an identical wavelength range, are dispersedly placed in nine grid-like blocks on the light receiving surface of the photodiode 2, so that the light receiving sections $R_{PD}$, $G_{PD}$ and $B_{PD}$ of each light receiving section group are present in positions different from each other on the light receiving surface of the photodiode 2, and therefore in the case of receiving the transmission light from the front side, the light receiving sections $R_{PD}$, $G_{PD}$ and $B_{PD}$ of each light receiving section group receive the transmission light, thereby achieving best reception performance. Moreover, even when transmission light coming obliquely from above the light receiving surface of the photodiode 2 is received and the transmission light does not strike upon the entire light receiving surface, the signal beam strikes upon at least a part of the respective light receiving sections $R_{PD}$, $G_{PD}$ and $B_{PD}$ of all the light receiving section groups, so that the reception limit angle in the oblique direction can be enlarged. Therefore, it becomes possible to realize an optical communication device with versatility which can communicate in visible light wavelength ranges with a simple configuration regardless of communication methods.

In the state where the respective light receiving sections $R_{PD}$, $G_{PD}$ and $B_{PD}$ of each light receiving section group are dispersedly placed in the respective blocks, which are placed like grid on the light receiving surface of the photodiode 2, the light receiving sections $R_{PD}$, $G_{PD}$ and $B_{PD}$ which are adjacent to each other along the row direction and the column direction have light receiving sensitivity to different wavelength ranges, so that the light receiving sections having the light receiving sensitivity to an identical wavelength range are not adjacent to each other but are dispersedly placed. Accordingly, in the case where transmission light coming obliquely from above the light receiving surface of the photodiode 2 is received and the transmission light strikes upon only a part of the light receiving surface, it becomes possible to ensure that the signal beam strikes upon at least a part of the respective light receiving sections $R_{PD}$, $G_{PD}$ and $B_{PD}$ of all the light receiving section groups.

Moreover, among the plurality of the light receiving sections $R_{PD}$, $G_{PD}$ and $B_{PD}$ of the photodiode 2, the light receiving sections $R_{PD}$, $G_{PD}$, or $B_{PD}$ in one light receiving section group, which have the light receiving sensitivity to an identical wavelength range, are connected to each other via the joints (21A, 21B; 22A, 223; or 23A, 23B), by which light receiving signals in one light receiving section group can be gathered so that one light receiving signal can be extracted from the light receiving section group to the outside via an output terminal.

The total area of the three light receiving sections $R_{PD}$, the total area of the three light receiving sections $G_{PD}$, and the total area of the three light receiving sections $B_{PD}$ of the photodiode 2 are made generally equal, so that when the transmission light coming from the front side is received, the light receiving section groups corresponding to the respective wavelength ranges have equal reception areas to receive the transmission light. Thus, if the level of the transmission light for every wavelength range is identical, then output signals of an identical level can be acquired.

Moreover, the light receiving surface of the photodiode 2 is divided into grid-like nine blocks in three rows and three columns, in which the light receiving sections $R_{PD}$ in the first light receiving section group are placed at a block of first row first column, a block of second row second column and a block of third row third column; the light receiving sections $G_{PD}$ in the second light receiving section group are placed at a block of first row second column, a bloc of second row third column and a block of third row first column; and the light receiving sections $B_{PD}$ in the third light receiving section group are placed at a block of first row third column, a block of second row first column and a block of third row second column, so that the light receiving section groups corresponding to three wavelengths can be placed dispersedly with efficiency.

Moreover, the light beam from the outside is condensed to the light receiving sections $R_{PD}$, $G_{PD}$ and $B_{PD}$ with use of the condenser lens 6 provided above the photodiode 2, so that the light receiving surface of the photodiode 2 can efficiently receive the transmission light, and thereby the communication distance can be increased.

Moreover, a plurality of light receiving signals from the photodiode 2 are converted by the receiving IC 3 and are outputted as intended output signals, which makes it possible to obtain a light receiving signal for every light receiving section group of which the component light receiving sections have sensitivity to light of an identical wavelength range.

A plurality of light receiving signals of the photodiode 2 are outputted from the receiving IC 3 to the outside as digital signals and analog signals, so that the device becomes applicable to both the digital communication system and the analog communication system, and thereby the versatility of the device is enhanced.

(Second Embodiment)

Figure 10:
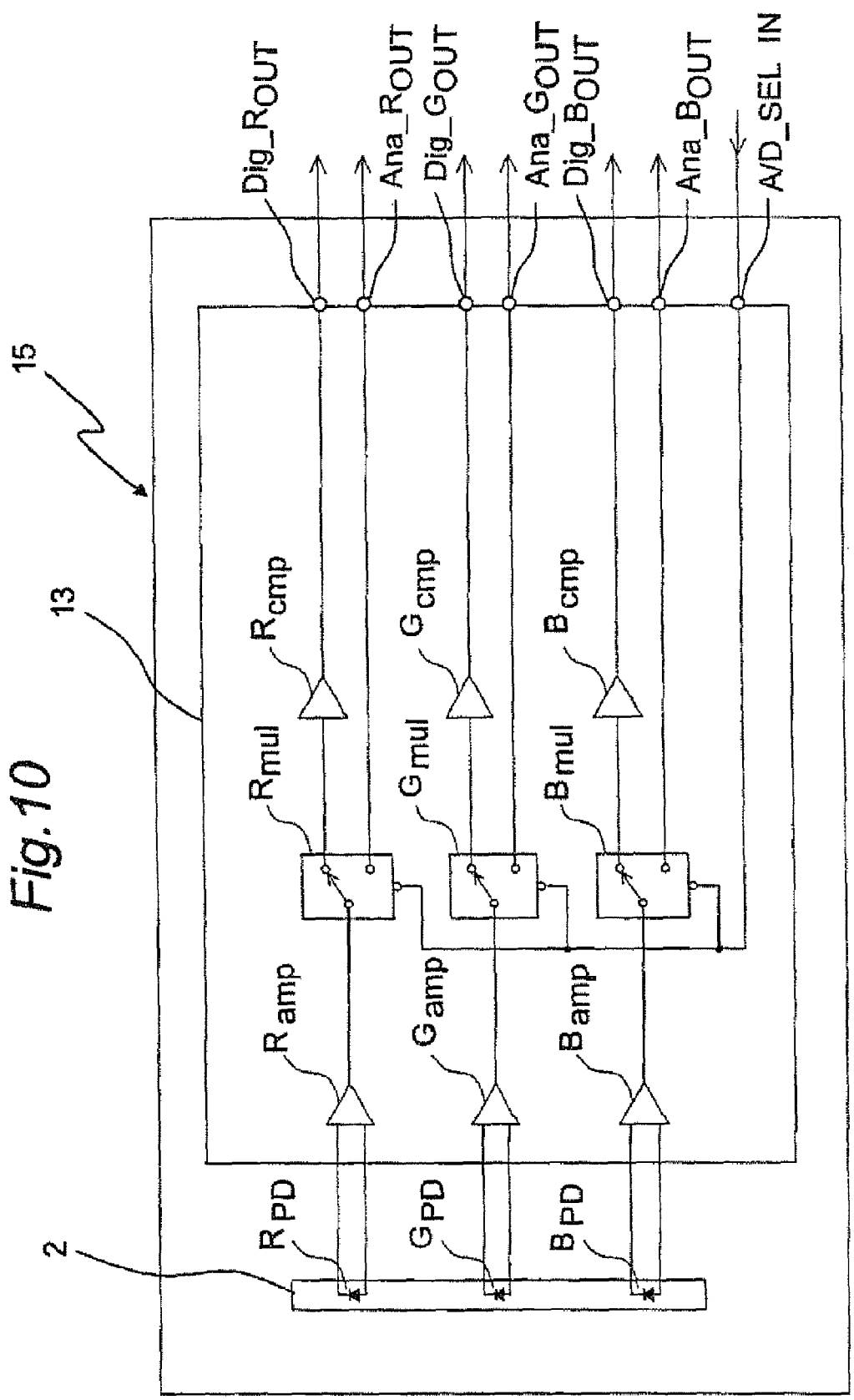
FIG. 10 is a block diagram of an optical communication device of a second embodiment.

FIG. 10 is a block diagram explaining an optical communication device of a second embodiment. The optical communication device of the second embodiment has the same configuration as the optical communication device of the first embodiment except for a receiving IC as an example of the receiving integrated circuit.

In the optical communication device of the second embodiment, light receiving signals outputted from amplification circuits $R_{amp}$, $G_{amp}$ and $B_{amp}$ for each wavelength range are inputted into selection circuits $R_{mul}$, $G_{mul}$ and $B_{mul}$ as an example of a switching section. The selection circuits $R_{mul}$, $G_{mul}$, and $B_{mul}$ are controlled by an analog/digital selection signal (signal selection signal), which is inputted through a signal input terminal for external connection A/D_SEL IN, such that the connection to the waveform shaping circuits $R_{cmp}$, $G_{cmp}$ and $B_{cmp}$ and the connection to the signal output terminals for external connection Ana_OUT are switched. Accordingly, with the analog output selected, the waveform shaping circuits $R_{cmp}$, $G_{cmp}$ and $B_{cmp}$ do not operate, and therefore power consumption can be reduced. It is to be noted that the control of the selection circuits $R_{mul}$, $G_{mul}$ and $B_{mul}$ for all wavelength lines may be simultaneously executed with use of a simple high level/low level logic of the A/D_SEL IN terminal (e.g., when an analog/digital selection signal is of high level, analog output is selected for all the wavelength lines, whereas when the analog/digital selection signal is of low level, digital output is selected for all the wavelength lines). Moreover, signal input terminals for external connection A/D_SEL IN may be separately provided for each of the selection circuits $R_{mul}$, $G_{mul}$ and $B_{mul}$, so that digital output and analog output may be controlled separately for each wavelength line.

The optical communication device of the second embodiment has the same effect as the optical communication device of the first embodiment.

Moreover, in response to a signal selection signal from the outside, each selection circuit $R_{mul}$, $G_{mul}$, $B_{mul}$ can select whether a light receiving signal from the photodiode 2 should be outputted as an analog signal or as a digital signal, so that the device becomes applicable to both the digital communication system and the analog communication system, and thereby versatility of the device can be enhanced.

(Third Embodiment)

Figure 11:
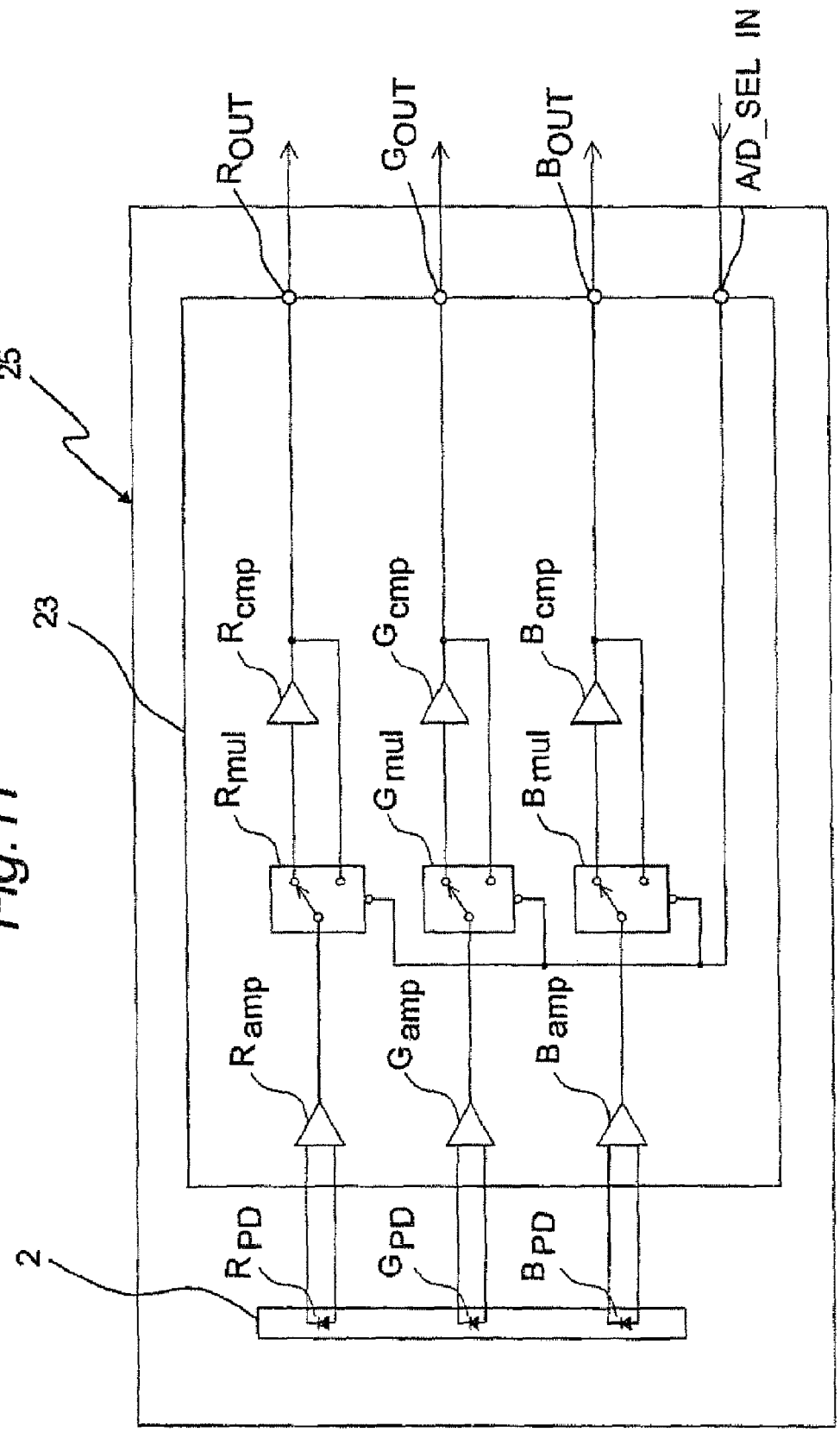
FIG. 11 is a block diagram of an optical communication device of a third embodiment.

FIG. 11 is a block diagram explaining an optical communication device of a third embodiment. The optical communication device of the third embodiment has the same configuration as the optical communication device of the second embodiment except for an external connection terminal.

The third embodiment is different from the second embodiment shown in FIG. 10 in that the third embodiment uses an external connection terminal which serves for both the analog output and the digital output, and an output signal is switched between analog and digital in response to an analog/digital selection signal (signal selection signal) inputted through the signal input terminal for external connection A/D_SEL IN. With this method employed, the number of terminals of the optical communication device is reduced, which contributes to downsizing of the device. This method is effective when an input section of a circuit, such as a controller, which is connected to the visible light communication device 5 has a terminal for both the digital output and the analog output.

The optical communication device of the third embodiment has the same effect as the optical communication device of the first embodiment.

In addition, the selection circuits $R_{mul}$, $G_{mul}$ and $B_{mul}$ can select for every one set a plurality of light receiving signals whether the light receiving signals are outputted as analog signals or digital signals in response to a signal selection signal received from the outsider so that the digital communication system and the analog communication system can be switched for every light receiving signal, and thereby versatility can be enhanced.

(Fourth Embodiment)

Figure 12:
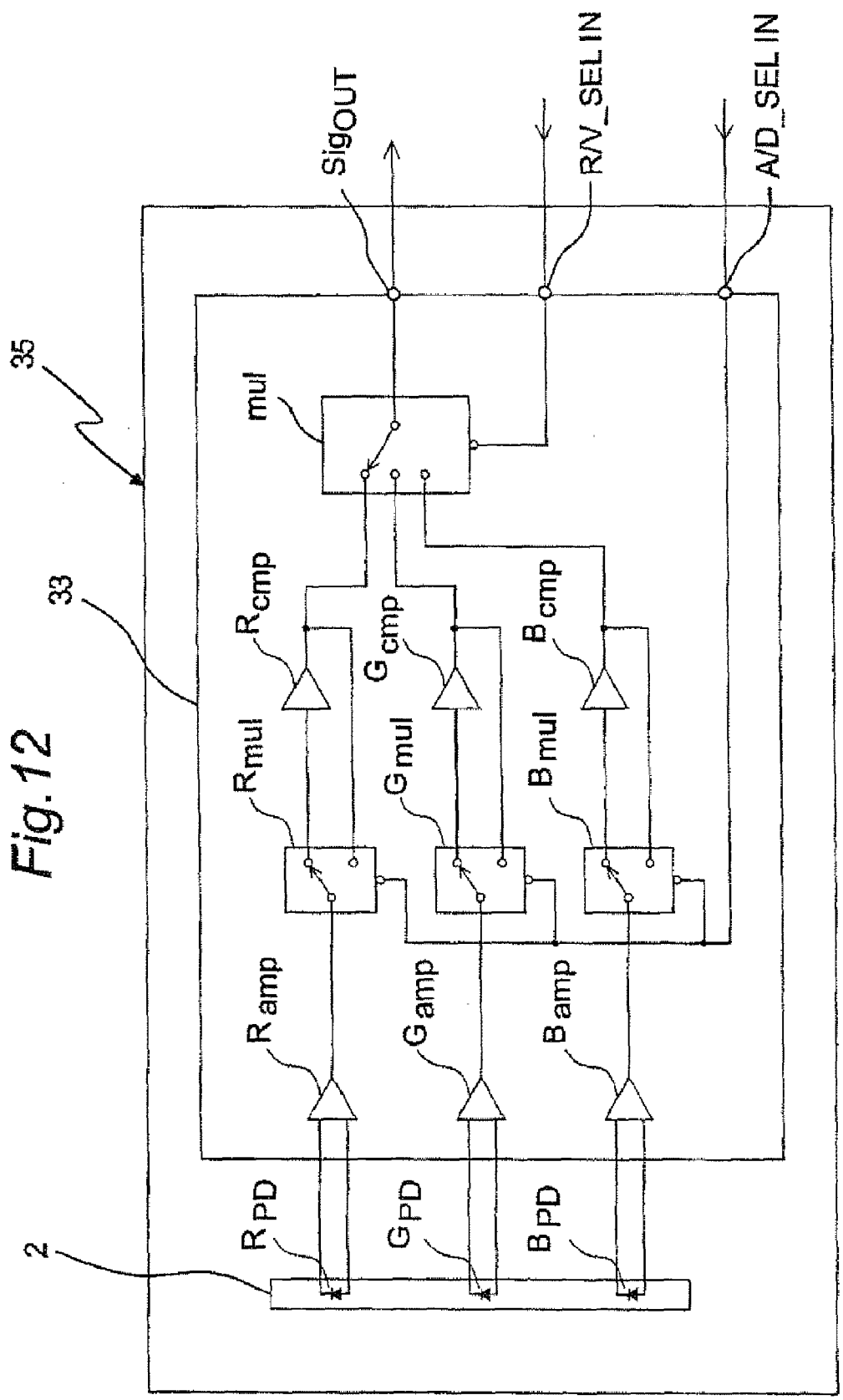
FIG. 12 is a block diagram of an optical communication device of a fourth embodiment.

FIG. 12 is a block diagram explaining an optical communication device of a fourth embodiment. The optical communication device of the fourth embodiment has the same configuration as the optical communication device of the third embodiment except for a selection circuit and an external connection terminal.

Light receiving signals of each wavelength range are inputted into a selection circuit mul as an example of the output selecting section. In the selection circuit mul, only a light receiving signal corresponding to one wavelength range is selected by an output selection signal inputted through a signal selection terminal for external connection R/V_SEL IN, and it is outputted through a signal output terminal for external connection Sig OUT.

Consequently, only one signal output terminal becomes necessary, which can achieve downsizing of the optical communication device and improvement in mounting reliability. This method is effective when the wavelength range used for communication is limited to one.

The optical communication device of the fourth embodiment has the same effect as the optical communication device of the first embodiment.

As is apparent from the above, according to the present invention, it is possible to obtain a visible light communication device which supports all the communication methods listed below while acquiring a very wide range of reception directivity angle (reception limit angle), which can contribute to downsizing, cost reduction and improvement in reliability of electronic equipment.

Analog visible light communication with white light;
Digital visible light communication with white light;
Analog visible light communication with the signal contents divided by the wavelength ranges of R, G and B;
Digital visible light communication with the signal contents divided by the wavelength ranges of R, G and B;
Mixed communication of the analog visible light communication and the digital infrared communication with the signal contents divided by the wavelength ranges of R, G and B; and
Mixed communication of the analog visible light communication and the analog infrared communication with the signal contents divided by the wavelength ranges of R, G and B.

Applying the optical communication device of any one of the first to the fourth embodiments to electronic equipment such as mobile phones and PDAs (Personal Digital Assistants) makes it possible to implement electronic equipment which can communicate in visible light wavelength ranges with a simplified configuration regardless of communication methods.

In the first through the fourth embodiments, although description has only been given of the placement example 1 of the R regions, G regions, and B regions of the optical communication device shown in FIG. 13A, the present invention is not limited thereto, and it should be understood that the same effect can be obtained with the placement example 2 to the placement example 6 shown in FIG. 13B to 13F.

Embodiments being thus described, it will be obvious that the same may be varied in many ways. Such variations are not to be regarded as a departure from the spirit and scope of the embodiment, and all such modifications as would be obvious to one skilled in the art are intended to be included within the scope of the following claims.

The invention claimed is:

1. An optical communication device, comprising:
a one-chip light receiving element having a plurality of light receiving sections with light receiving sensitivity to different wavelength ranges in a visible light spectrum, wherein
the plurality of light receiving sections are divided into different light receiving section groups by the wavelength range to which the light receiving sections have the light receiving sensitivity, each light receiving section group including a plurality of light receiving sections,
the light receiving element has a light receiving surface divided into a plurality of blocks arranged in rows and columns,
the light receiving sections constituting one light receiving section group having the light receiving sensitivity to an identical wavelength range are dispersedly placed over the light receiving surface, with these light receiving sections being placed in the respective blocks of the light receiving surface that are not adjacent to each other in a row direction nor in a column direction, and
the light receiving sections in one light receiving section group having the light receiving sensitivity to an identical wavelength range are connected to each other via joints.

2. The optical communication device according to claim 1, wherein
the blocks of the light receiving surface of the light receiving element are grid-like blocks, and
the light receiving sections adjacent to each other along the row direction and the column direction of the light receiving element have the light receiving sensitivity to different wavelength ranges.

3. The optical communication device according to claim 1, wherein
the light receiving section groups are almost equal in a total area of the light receiving sections of the group.

4. The optical communication device according to claim 1, wherein
there are three light receiving section groups, each of which has three light receiving sections having light receiving sensitivity to an identical wavelength range, wherein
the light receiving surface of the light receiving element is divided into grid-like nine blocks of three rows and three columns, in which a first light receiving section group is placed at a block of first row first column, a block of second row second column, and a block of third row third column; a second light receiving section group is placed at a block of first row second column, a bloc of second row third column, and a block of third row first column, and a third light receiving section group is placed at a block of first row third column, a block of second row first column, and a block of third row second column.

5. The optical communication device according to claim 1, further comprising:
a condenser lens provided above the light receiving element for condensing an external light beam to a plurality of light receiving sections.

6. The optical communication device according to claim 1, wherein
the light receiving element is configured to output a plurality of light receiving signals, said light receiving signals having undergone photoelectric conversion per every light receiving section group which has light receiving sensitivity to the identical wavelength range, and the optical communication device further comprises a receiving integrated circuit for converting the plurality of light receiving signals from the light receiving element and outputting the signals as intended output signals.

7. An electronic equipment comprising the optical communication device according to claim 1.

8. The optical communication device according to claim 6, wherein
the receiving integrated circuit outputs the plurality of light receiving signals received from the light receiving element to outside as digital signals.

9. The optical communication device according to claim 6, wherein
the receiving integrated circuit outputs the plurality of light receiving signals received from the light receiving element to outside as analog signals.

10. The optical communication device according to claim 6, wherein
the receiving integrated circuit is configured to output the plurality of light receiving signals received from the light receiving element to outside as digital signals and also as analog signals.

11. The optical communication device according to claim 6, wherein
the receiving integrated circuit has a switching section for, in response to a signal selection signal received from outside, selecting whether to output each of the plurality of light receiving signals received from the light receiving element as an analog signal or as a digital signal.

12. The optical communication device according to claim 11, wherein
in response to the signal selection signal, the switching section of the receiving integrated circuit selects collectively per the plurality of the light receiving signals whether to output the light receiving signals as analog signals or as digital signals.

13. The optical communication device according to claim 12, wherein
the receiving integrated circuit has an output selecting section for selecting any one of a plurality of light receiving signals switched by the switching section in response to an output selection signal received from outside, and outputting the selected signal to the outside.

14. An optical communication device, comprising:
a one-chip light receiving element having a plurality of light receiving sections with light receiving sensitivity to different wavelength ranges in a visible light spectrum, wherein
the plurality of light receiving sections are divided into different light receiving section groups by the wavelength range to which the light receiving sections have the light receiving sensitivity, each light receiving section group including a plurality of light receiving sections,
the light receiving element has a light receiving surface divided into a plurality of blocks arranged in rows and columns,
the light receiving sections constituting one light receiving section group having the light receiving sensitivity to an identical wavelength range are dispersedly placed over the light receiving surface, with these light receiving sections being placed in the respective blocks of the light receiving surface that are not adjacent to each other in a row direction nor in a column direction, and
the light receiving section groups are almost equal in a total area of the light receiving sections of the group.

15. The optical communication device according to claim 14, wherein
the blocks of the light receiving surface of the light receiving element are grid-like blocks, and
the light receiving sections adjacent to each other along the row direction and the column direction of the light receiving element have the light receiving sensitivity to different wavelength ranges.

16. The optical communication device according to claim 14, wherein
among the plurality of light receiving sections of the light receiving element, light receiving sections in one light receiving section group having the light receiving sensitivity to an identical wavelength range are connected to each other via joints.

17. The optical communication device according to claim 14, wherein
there are three light receiving section groups, each of which has three light receiving sections having light receiving sensitivity to an identical wavelength range, wherein
the light receiving surface of the light receiving element is divided into grid-like nine blocks of three rows and three columns, in which a first light receiving section group is placed at a block of first row first column, a block of second row second column, and a block of third row third column; a second light receiving section group is placed at a block of first row second column, a block of second row third column, and a block of third row first column, and a third light receiving section group is placed at a block of first row third column, a block of second row first column, and a block of third row second column.

18. The optical communication device according to claim 14, further comprising:
a condenser lens provided above the light receiving element for condensing an external light beam to a plurality of light receiving sections.

19. The optical communication device according to claim 14, wherein
the light receiving element is configured to output a plurality of light receiving signals, said light receiving signals having undergone photoelectric conversion per every light receiving section group which has light receiving sensitivity to the identical wavelength range, and
the optical communication device further comprises a receiving integrated circuit for converting the plurality of light receiving signals from the light receiving element and outputting the signals as intended output signals.

20. An electronic equipment comprising the optical communication device according to claim 14.

21. The optical communication device according to claim 19, wherein
the receiving integrated circuit outputs the plurality of light receiving signals received from the light receiving element to outside as digital signals.

22. The optical communication device according to claim 19, wherein
the receiving integrated circuit outputs the plurality of light receiving signals received from the light receiving element to outside as analog signals.

23. The optical communication device according to claim 19, wherein
the receiving integrated circuit is configured to output the plurality of light receiving signals received from the light receiving element to outside as digital signals and also as analog signals.

24. The optical communication device according to claim 19, wherein
the receiving integrated circuit has a switching section for, in response to a signal selection signal received from outside, selecting whether to output each of the plurality of light receiving signals received from the light receiving element as an analog signal or as a digital signal.

25. The optical communication device according to claim 24, wherein
in response to the signal selection signal, the switching section of the receiving integrated circuit selects collectively per the plurality of the light receiving signals whether to output the light receiving signals as analog signals or as digital signals.

26. The optical communication device according to claim 25, wherein
the receiving integrated circuit has an output selecting section for selecting any one of a plurality of light receiving signals switched by the switching section in response to an output selection signal received from outside, and outputting the selected signal to the outside.

* * * * *